United States Patent [19]
Fujita

[11] Patent Number: 5,576,630
[45] Date of Patent: Nov. 19, 1996

[54] PROBE STRUCTURE FOR MEASURING ELECTRIC CHARACTERISTICS OF A SEMICONDUCTOR ELEMENT

[75] Inventor: Kazuhide Fujita, Osaka, Japan

[73] Assignee: Nitto Denko Corporation, Osaka, Japan

[21] Appl. No.: 260,992

[22] Filed: Jun. 16, 1994

[30] Foreign Application Priority Data

| Jun. 16, 1993 | [JP] | Japan | 5-144959 |
| Jun. 16, 1993 | [JP] | Japan | 5-144964 |
| Aug. 19, 1993 | [JP] | Japan | 5-205390 |
| Aug. 19, 1993 | [JP] | Japan | 5-205393 |

[51] Int. Cl.$^6$ .................................................. G01R 31/02
[52] U.S. Cl. ........................................... 324/760; 324/754
[58] Field of Search ..................................... 324/754, 760, 324/761, 762

[56] References Cited

U.S. PATENT DOCUMENTS

| 4,189,825 | 2/1980 | Robillard et al. | 29/574 |
| 4,912,399 | 3/1990 | Greub | 324/754 |
| 5,027,063 | 6/1991 | Letourneau | 324/158 |
| 5,103,557 | 4/1992 | Leedy | 324/754 |

FOREIGN PATENT DOCUMENTS

| 0131375 | 1/1985 | European Pat. Off. . | |
| 0230348 | 7/1987 | European Pat. Off. . | |
| 62-182672 | 8/1987 | Japan | G01R 1/073 |

OTHER PUBLICATIONS

G. O. Jameson, "Frost Free Cold Probe", IBM Technical Disclosure Bulletin, vol. 13, No. 10, Mar. 1971, p. 3121.
Moskowitz, "Electrical Performance of High Density Probe Array For Testing Josephson Circuit Chips", IEEE Transactions on Magnetics, vol. MAG–17, No. 1, Jan. 1981, pp. 761–763.

Primary Examiner—Ernest F. Karlsen
Assistant Examiner—Russell M. Kobert
Attorney, Agent, or Firm—Sughrue, Mion, Zinn, Macpeak & Seas

[57] ABSTRACT

A probe structure for measuring electric characteristics of a semiconductor element containing a first electrically conductive circuit board having a structure wherein the contact portions, which are contacted with the terminals of a material to be tested, are disposed in a first insulator in the direction of the thickness thereof so as to penetrate the insulator and are connected to a first electrically conductive wiring formed between the first insulator and a second insulator. The probe structure also contains a second electrically conductive circuit board having a coefficient of thermal expansion which is the same as or similar to that of the material to be tested and having a structure wherein the first electrically conductive wiring is connected to a second electrically conductive wiring which, in turn, is connected to an electric tester for testing the electric characteristics of the material to be tested. The first electrically conductive circuit board is electrically connected to the second electrically conductive circuit board, and an elastic body is disposed between the first electrically conductive circuit board and the second electrically conductive circuit board.

6 Claims, 12 Drawing Sheets

PROBE STRUCTURE FOR MEASURING ELECTRIC CHARACTERISTICS OF A SEMICONDUCTOR ELEMENT

FIELD OF THE INVENTION

The present invention relates to a probe structure used for measuring various electric characteristics of a semiconductor element, such as an integrated circuit (hereinafter referred to as "IC"), or used for a burn-in test conducted at a high temperature. More particularly, it relates to a probe structure which can be used for measuring various electric characteristics of an IC in the wafer state before dicing.

BACKGROUND OF THE INVENTION

A conventional burn-in test of an IC chip employs a method of packaging the IC, inserting the packaged IC in a socket disposed on a printed circuit board and testing while applying a load voltage at a high temperature, but the need for an unpackaged IC chip, which has already been subjected to a burn-in test and an electric test, has increased for a chip on a board or a multichip module, and development of such has progressed rapidly in recent times.

In particular, testing of an IC before dicing has many advantages; for example, the cost for the test is decreased, the testing apparatus is small-sized, the testing time is shortened, the yield of ICs is improved since the cause of a defect(s) during the production of the IC is identified and can be corrected, the shipment is rationalized, etc.

A so-called probe card having bumps for connecting an electrically conductive circuit and IC pads to an insulating holder having a flexibility has recently been developed to conduct the electric test in a die level, as disclosed in, for example, JP-A-62-182672 (the term "JP-A", as used herein, means an "unexamined published Japanese patent application"), but the probe card is for the test in a die level.

To test all ICs on a wafer at the same time in a wafer scale, it is necessary to make the wiring very close or employ a multilayer wiring structure.

However, if the multilayer wiring structure is employed to increase the wiring density, the flexibility of the probe card is lost, whereby it is impossible to absorb the variation of the height of the IC pads, and a good connection between the bump of the probe card and the IC pads cannot be obtained.

Even if monolayer wiring can be attained using a high density wiring board, where an organic polymeric material having a flexibility, such as polyimide, an epoxy resin, polyether imide, polysulfone, benzocylcobutene, etc., is used as a substrate material, since a coefficient of thermal expansion of the organic polymeric material greatly differs from that of silicon (which is the material of the wafer), and, hence, there is the problem that when a burn-in test is conducted, a positional shift between the bump and the IC pad occurs due to the difference in the dimensional change at high temperatures (about 150° C.), a good connection is not obtained.

Further, where an inorganic material having substantially the same coefficient of thermal expansion as that of a silicon wafer, such as a silicon substrate, a ceramic substrate, a glass substrate, a metal substrate, etc., is used, there is a problem in flexibility and it is difficult to obtain a sure connection.

SUMMARY OF THE INVENTION

The present invention effectively overcomes the conventional problems described above.

Accordingly, an object of the present invention is to provide a probe structure which can perform, at the same time, the electric test of semiconductor elements such as ICs, etc, in particular, a burn-in test thereof in a wafer scale.

The probe structure according to the present invention comprises:

a first electrically conductive circuit board having a structure wherein contact portions, which are contacted with terminals of a material to be tested, are disposed in a first insulator in the direction of the thickness thereof so as to penetrate the insulator, and the contact portions are connected to a first electrically conductive wiring formed between the first insulator and a second insulator; and a second electrically conductive circuit board having a coefficient of thermal expansion which is the same as or similar to that of the material to be tested, and having a structure wherein the first electrically conductive wiring is connected to a second electrically conductive wiring which is connected to an electric tester for testing the electric characteristics of the material to be tested; wherein, the first electrically conductive circuit is electrically connected to the second electrically conductive circuit.

According to one preferred embodiment of the present invention, an elastic body is disposed between the first electrically conductive circuit board and the second electrically conductive circuit board.

According to another preferred embodiment of the present invention, at least one resistor is connected in series to a signal wiring of the second electrically conductive wiring, and electric power supplying wirings are mutually and independently wired to the second electrically conductive wiring.

According to still another preferred embodiment of the present invention, the second electrically conductive circuit board comprises a plurality of electrically conductive circuit boards joined to each other or fixed to a printed plate board in one body.

In particular, in the probe structure of the present invention, the material to be tested is not only an IC chip, but also an integrated circuit formed on a wafer before dicing.

DETAILED DESCRIPTION OF THE INVENTION

Figure 1:
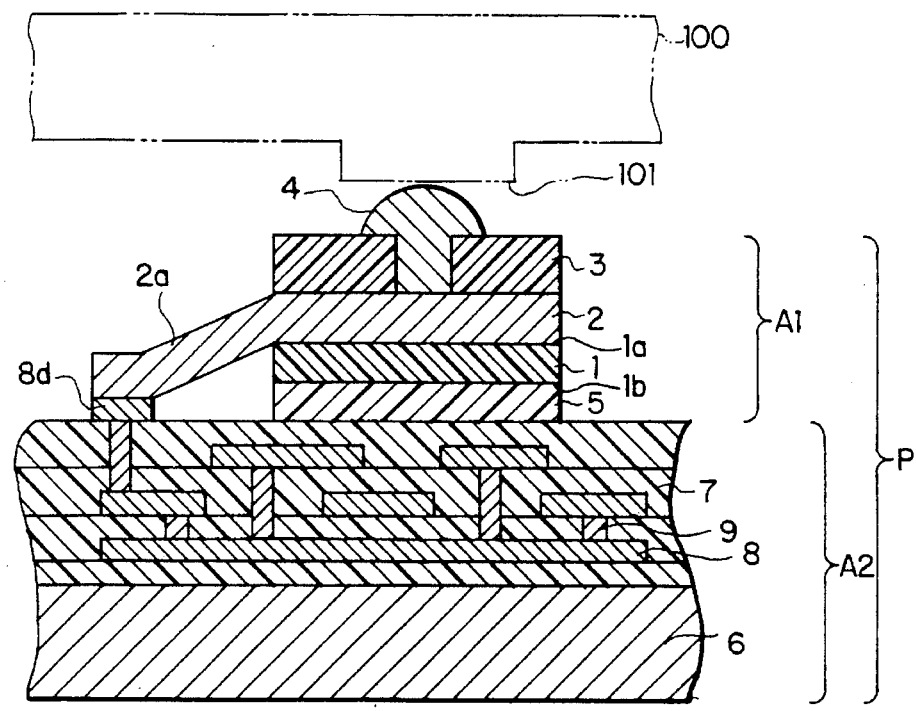
FIG. 1 is an enlarged cross sectional view showing one example of the probe structure of the present invention.

The present invention is described in detail below.

The term "material to be tested" as used herein, means a semiconductor element, a semiconductor element assembly (a silicon wafer before dicing, a silicon chip after dicing, etc.), a semiconductor device, a circuit plate board for carrying a semiconductor device, a circuit plate board for a liquid crystal display (LCD), etc.

The term "terminal," as used herein, includes a pad, a land, etc.

The term "contact portion," as used herein, means an electrical conductor which is electrically connected to the terminal of a material to be tested by contacting therewith. There is no particular restriction on the form of the contact portion, and the form thereof can be a flat form such as a triangle, a regular square, a rectangle, a trapezoid, a parallelogram, other polygons, a circle, etc.; or a steric form such as a square column, a circular column, a sphere, a conical form (a circular cone, a square cone, etc.), etc. Accordingly, the contact point between the contact portion and the terminal of the material to be tested can be not only a point form but also a line form or a flat form. Further, it is not always necessary for the contact portion to be formed such that the contact portion is projected to the outside direction from the surface of the first insulator; that is, the contact portion may be in a desired form according to the layout of the material to be tested or the form of the circuit.

The term "electrically conductive circuit," as used herein, broadly includes parts such as boards, coils, resistors, condensers, etc., and electrically conductive wirings.

According to the probe structure of the present invention, the positional shift between the material to be tested and the probe structure due to the difference in the coefficient of thermal expansion is minimized so as to improve the contact. Hence, the electrical connection can be effectively established.

That is, in the first electrically conductive circuit board, the contact portion connected to the first electrically conductive wiring, which is formed between the first insulator and the second insulator and formed in the first insulator penetrating in the direction of thickness thereof, is contacted with the terminal of the material to be tested. Since the first electrically conductive wiring is connected to the second electrically conductive wiring, which is connected to an electric tester for testing the electric characteristics of the material to be tested, a signal having a specific frequency (for testing the electric characteristics of the material to be tested) is input into the terminal of the material to be tested in order to perform the testing of the electric characteristics of the IC. In this case, the first electrically conductive circuit board keeps a flexibility over the whole probe structure, and can absorb the variation of the heights of the terminals of the material to be tested.

Further, since the coefficient of thermal expansion of the second electrically conductive circuit board is the same as or similar to that of the material to be tested, the second electrically conductive circuit board can absorb the dimensional change associated with the change in the temperature of the first electrically conductive circuit board, and the occurrence of the contact shift between the contact portion of the first electrically conductive circuit board and the terminal of the material to be tested can be prevented. Accordingly, by disposing a plurality of first electrically conductive circuit boards fractionated into, for example, the sizes each corresponding to each of a plurality of ICs formed on a wafer or into appropriate sizes on the second electrically conductive circuit board, the positional shift between the contact portion of the probe structure and the terminals of the ICs due to the difference in the coefficient of thermal expansion between the wafer and that of the probe structure in the burn-in test in a wafer scale can be minimized and the electrical connection can be effectively established.

Where an elastic body is disposed between the first electrically conductive circuit board and the second electrically conductive circuit board, the compliance characteristics for absorbing the variation in the height between the contact portions of the probe structure and the terminal of the material to be tested are further improved and the electrical connection is more effectively established.

Further, where the material to be tested is an IC formed on a wafer before dicing, the reduction of the test cost, small-sizing of the testing apparatus, shortening of the testing time, improvement in the yield due to identifying the cause of any defect(s) in the production of the IC, the rationalization of the shipment, etc., can all be achieved relative to the case of an IC chip after dicing.

Since at least one resistor is connected in series to a signal wiring in the second electrically conductive wiring, a load voltage can be applied to the material to be tested and the occurrence of overcurrent due to a short-circuit of the material to be tested can be prevented.

In particular, where condensers are connected in parallel to the resistors, the occurrence of noise can be reduced.

Where a plurality of materials to be tested are used and the signal wirings corresponding to the terminal of each material to be tested are mutually connected in parallel via the resistors, the ground wirings in the second electrically conductive wiring are also connected in parallel and can be connected to one common wiring, whereby the number of inlet and outlet wirings to the electric tester can be reduced.

Further, where electric power supplying wirings in the second electrically conductive wiring are mutually independent, the problem can be overcome that when electric power supplying wirings are connected in parallel, if the electric power supplying wiring in even one of the materials to be tested is grounded by a short-circuit, the electric power is not simultaneously supplied to other materials to be tested, so as to make the testing thereof impossible.

The present invention is described in more detail by reference to the embodiments shown in the accompanying drawings, but the invention is not limited thereto.

FIG. 1 is an enlarged cross sectional view showing one example of the probe structure of the present invention.

As shown in FIG. 1, the probe structure P is formed by disposing a first electrically conductive circuit board A1 on a second electrically conductive circuit board A2. In the first electrically conductive circuit board A1, a first electrically conductive wiring 2 is disposed on one surface 1a of an insulating substrate 1, which is a second insulator, and a cover coat 3, which is a first insulator, is disposed on the first electrically conductive wiring 2. In the cover coat 3 is formed a rivet-form metal projection (hereinafter referred to as "bump") 4, which is a contact portion, penetrating in the direction of thickness, and one end portion of the bump 4 is connected to the first electrically conductive wiring 2. At the other surface 1b of the insulating substrate 1 is disposed an elastic body 5, such as a silicone rubber, etc., the elastic body 5 is disposed on the second electrically conductive circuit board A2 at a definite position, and is fixed thereto with an adhesive, etc.

The second electrically conductive circuit board A2 is a multichip module substrate having a multilayer wiring structure, wherein the second electrically conductive wirings of a multilayer structure is formed on a substrate 6, such as a ceramic substrate, etc. Electrically conductive wirings 8 (which are the second electrically conductive wirings) are insulated with a plurality of insulator layers 7, and the layers of the electrically conductive wirings 8 are connected to each other by electrically conductive paths 9. The electrically conductive wirings 8 are connected to an electric tester (not shown) for testing the electric characteristics of the material to be tested, such as an IC, etc.

In the first electrically conductive circuit board A1, a lead 2a is projected from the first electrically conductive wire 2 and the lead 2a is connected to a terminal 8d, which is a part of the second electrically conductive wirings. Accordingly, when the bump 4 of the first electrically conductive circuit board A1 is contacted with a pad 101 of the IC formed on a wafer 100, shown by the imaginary line, a signal having a specific frequency from the electric tester is input into the pad 101 and the electric characteristics of IC are tested.

The first electrically conductive circuit board A1 keeps the flexibility of the probe structure P itself and can absorb the variation in the height between the bump 4 and the pad 101 of the IC. The coefficient of thermal expansion of the second electrically conductive circuit board A2 is the same as or similar to that of the wafer 100, whereby the second electrically conductive circuit board A2 can absorb the dimensional change by the temperature change of the first electrically conductive circuit board A1 and, thus, the occurrence of the connection shift between the bump 4 and the pad 101 of the IC can be prevented.

Each of the first electrically conductive circuit board A1 and the second electrically conductive circuit board A2 is described in detail below.

1. First Electrically Conductive Circuit Board A1

Figure 2:
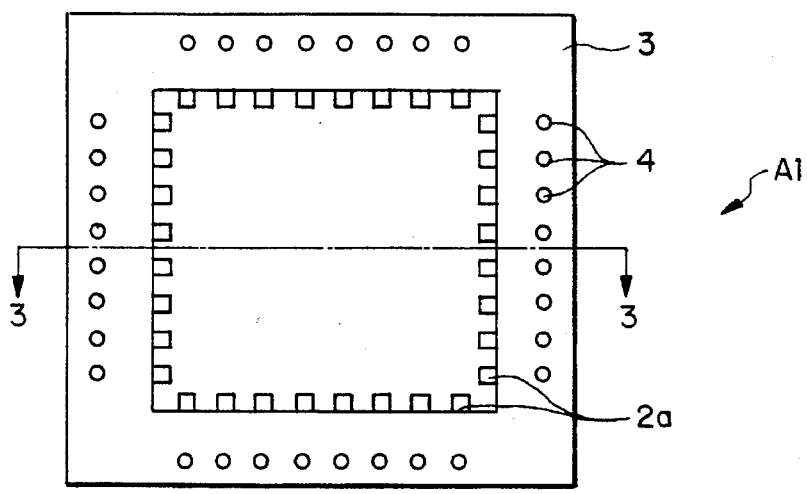
FIG. 2 is a plain view showing one example of the first electrically conductive circuit board A1.
Figure 3:
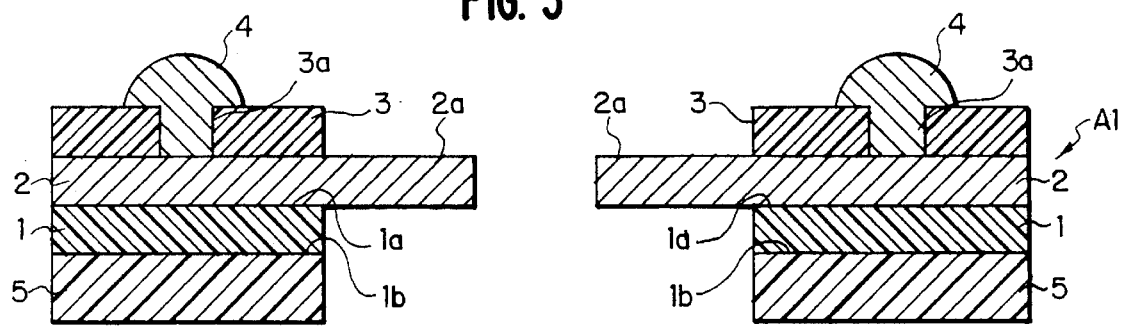
FIG. 3 is the cross sectional view taken along the line A–B of FIG. 2.

FIG. 2 is a plain view showing one example of the first electrically conductive circuit board A1, and FIG. 3 is the cross sectional view taken along the line A–B of FIG. 2. The first electrically conductive circuit board A1 is a printed circuit board having flexibility and is fractionated into the sizes each corresponding to one IC in a wafer or into appropriate sizes.

On one surface 1a of an insulating substrate 1 (having flexibility) is disposed a first electrically conductive wiring 2, and a cover coat 3 (which is a second insulator) is disposed on the first electrically conductive wiring 2 to cover the same.

There is no particular restriction on the materials for the insulating substrate 1 (having a flexibility) and the cover coat 3 so long as the materials can stably support a bump 4 and have an electrical insulating property. Practically, organic polymeric materials such as polyimide, an epoxy resin, polyether imide, polysulfone, benzocyclobutene (BCB, made by Dow Chemical Company), polyester, fluorocarbon, polyurethane, polyamide, polycarbonate, etc., can be used as the materials. In these organic polymeric materials, polyimide having excellent heat resistance and mechanical strength is particularly suitably used.

There is no particular restriction on the thickness of the insulating substrate 1 and the cover coat 3, but the thickness is usually from 2 to 200 μm, and, preferably, from 5 to 100 μm, so as to impart a sufficient mechanical strength and flexibility.

As the material for the first electrically conductive wiring 2, in addition to copper, other metals such as Au, Ag, Be, Mo, Ni, Co, W, Ti, In, Zn, Al, Sn, Pb, Pt, Pd, etc., or the alloys thereof, can also be used.

There is no particular restriction on the thickness of the first electrically conductive wiring 2, but the thickness is usually from 0.1 to 100 μm, and, preferably, from 1 to 50 μm.

For inserting a bump 4, a penetrated hole 3a is formed in the cover coat 3 in the direction of the thickness thereof, and, to use a part of the first electrically conductive wiring 2 as a lead 2a, a part of the insulating substrate 1 is removed. A perforating means of the cover coat 3 and a means of removing a part of the insulating substrate 1 include the following methods.

(a) A dry etching method utilizing a high energy beam, such as laser light (e.g., an excimer laser, a carbonic acid gas laser, a YAG laser, an Ar laser, etc.), and also ion beam etching, sputter etching, electrical discharge machining, etc.

(b) A lithographic method using a photosensitive polyimide resin, a photosensitive epoxy resin, a photosensitive benzocyclobutene, a photosensitive acrylic resin, etc., as the insulating substrate 1 and the cover coat 3.

(c) A chemical etching method of performing wet etching with an alkali solution or a hydrazine solution by using KAPTON (a trademark representing a polyimide film made by E.I. Du Pont de Nemours and Company), which is a polyimide resin, etc., for the insulating substrate 1 and the cover coat 3.

After forming the penetrated hole 3a, as described above, the bump 4 is formed by conducting electrolytic plating by passing an electric current from the first electrically conductive wiring 2 (using the first electrically conductive wiring 2) to the bottom surface of the penetrated hole 3a as an electrode. By applying electrolytic plating, a metal is filled in the penetrated hole 3a to form an electrically conductive path, and by further growing plating, the bump 4, which is a rivet-form connecting terminal, is formed.

As the main component, the material for the bump 4 can be selected from metals which can be electrolytically plated, such as Ni, Co, W, Mo, Au, Cu, Zn, Sn, Pb, Fe, Cd, In, Pt, Pd, Ag, Cr, Rh, etc., and the alloys thereof or the appropriate combinations thereof.

Another method of forming the bump 4 is electroless plating using a reducing agent. In this case, metals which can be electrolessly plated, such as Au, Ni, Co, Cu, Zn, Pb, Sn, Fe, Ag, Pt, In, Rh, etc., and the alloys of these metals, can be used as the material for the bump 4.

At the other surface 1b of the insulating substrate 1, that is, the surface opposite the bump 4, is disposed an elastic body 5 such as a silicone rubber, etc.

As the elastic body 5, elastic bodies such as fluorine rubbers, etc., can be used in addition to the silicone rubber. The material having a rubber elasticity is disposed on the first electrically conductive circuit board A1 or the second electrically conductive circuit board A2 with a definite form by cutting a sheet form thereof, by a screen printing method, or a photolithographic method, etc.

The thickness of the elastic body 5 is from 5 to 1,000 μm, and, preferably, from 20 to 500 μm, to absorb the variation in the height of the terminal of the material to be tested in order to more effectively ensure the electrical connection between the terminal of the material to be tested and the bump 4.

A plurality of units (wherein one unit is one or several first electrically conductive circuit boards A1, as shown in FIG. 2 and FIG. 3) are disposed on the second electrically conductive circuit boards A2 corresponding to the dispositions of ICs on a wafer.

FIG. 4, FIG. 5 and FIGS. 7 to 9 are cross sectional views showing other examples of the first electrically conductive circuit board A1, respectively. In the following embodiments, the portions having the same numerals as in FIG. 1 show the same or corresponding portions.

Figure 4:
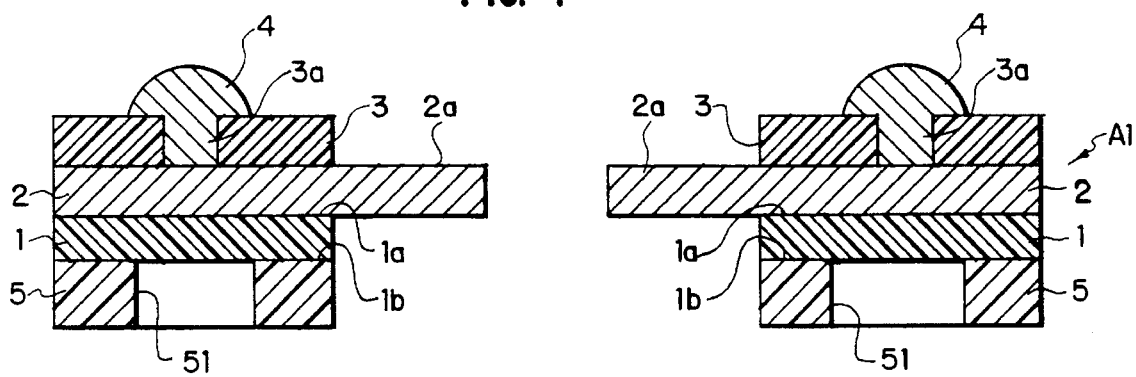
FIG. 4 is an enlarged cross sectional view showing another example of the first electrically conductive circuit board A1.

In the first electrically conductive circuit board A1, as shown in FIG. 4 as one embodiment, it should be noted that the elastic body 5 is formed at the peripheral portion of the other surface 1b of an insulating substrate 1 and, also, a concaved portion 51 (such as a penetrated hole or a penetrated groove penetrating the elastic body 5 in the direction of the thickness) is formed in the elastic body at the region corresponding to the portion where the bump 4 is formed.

In FIG. 4, the concaved portion 51 is hollow, but an elastic body having a elastic coefficient smaller than that of the elastic body 5 may be filled in the concaved portion 5 or the elastic body 5 may comprise a metal plate or an insulating plate. In such a structure, the cushioning property of the elastic body 5 is improved, and injuring of the terminal of a material to be tested in contacting the terminal with the bump 4 can be prevented.

Figure 5:
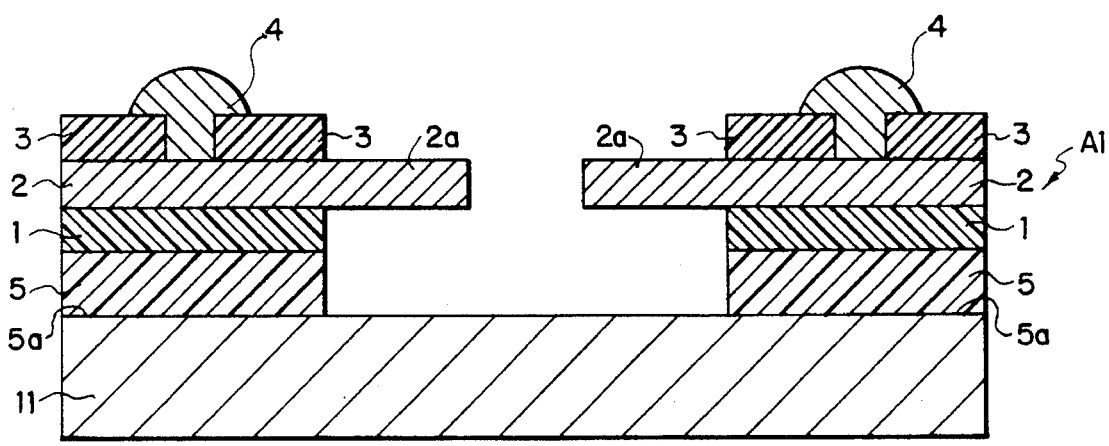
FIG. 5 is an enlarged cross sectional view showing still another example of the first electrically conductive circuit board A1.

In the embodiment shown in FIG. 5, it should be noted that backing 11 of a metal plate, an insulating plate, etc., is formed at one surface 5a of the elastic body 5 to facilitate fixing of the first electrically conductive circuit board A1 to the second electrically conductive circuit board A2. There is no particular restriction on the thickness of the backing 11, but the thickness is usually from 50 to 2,000 μm, and, preferably, from 100 to 500 μm.

Figure 6:
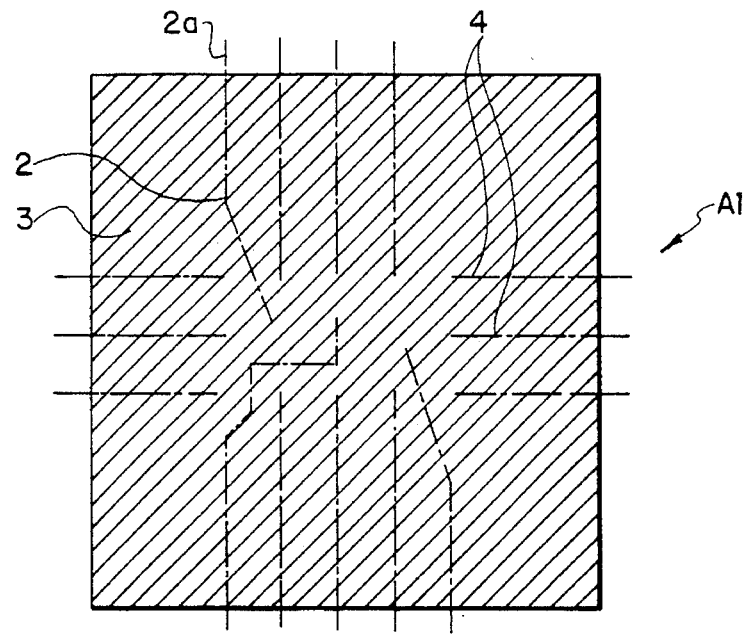
FIG. 6 is a plain view showing another example of the first electrically conductive circuit board A1.
Figure 7:
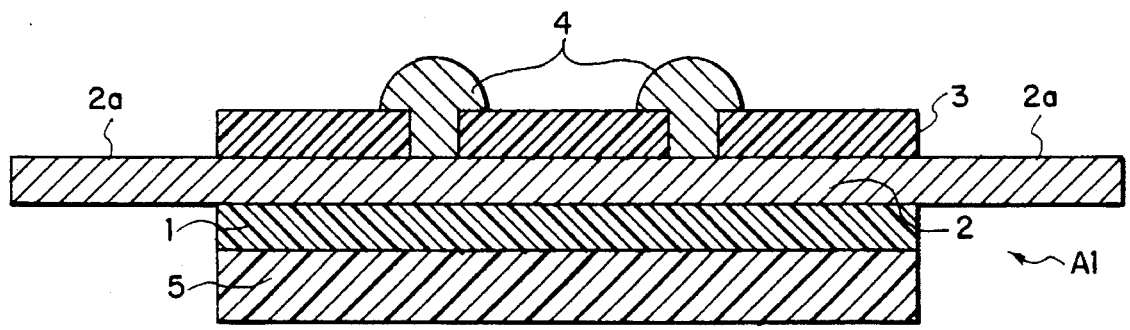
FIG. 7 is an enlarged cross sectional view of FIG. 6.

FIG. 6 is a plain view showing another example of the first electrically conductive circuit board A1, and FIG. 7 is the cross sectional view of FIG. 6. In the embodiments shown in FIG. 2 and FIG. 3, the connecting pads of IC are disposed at the periphery of the IC, but the first electrically conductive circuit board A1 can be configured such that the circuit board A1 corresponds to the IC pads disposed at the central portion of the IC in an array form as shown in FIG. 6 and FIG. 7.

Figure 8:
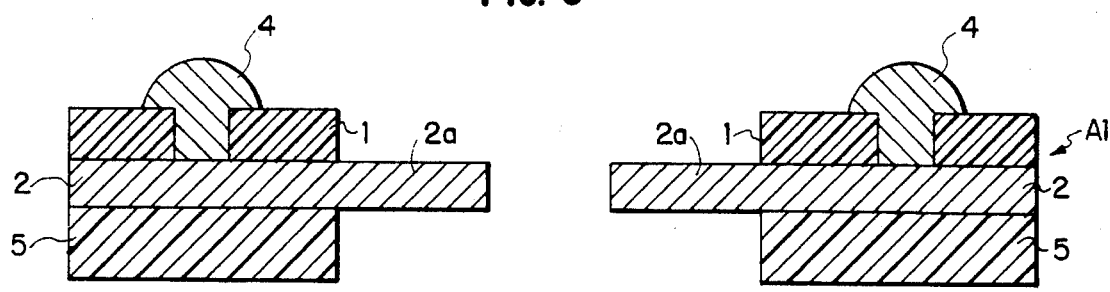
FIG. 8 is an enlarged cross sectional view showing another example of the first electrically conductive circuit board A1.

In the embodiment shown in FIG. 8, it should be noted that a cover coat 3 is not formed, bumps 4 are formed in an insulating substrate 1 penetrating in the direction of thickness, and a first electrically conductive wiring 2 is formed between the insulating substrate 1 and an elastic body 5. According to the embodiment shown in FIG. 8, the step of forming a cover coat 3 is omitted to improve productivity and also to thin the first electrically conductive circuit board A1, whereby good compliance characteristics can be obtained.

Figure 9:
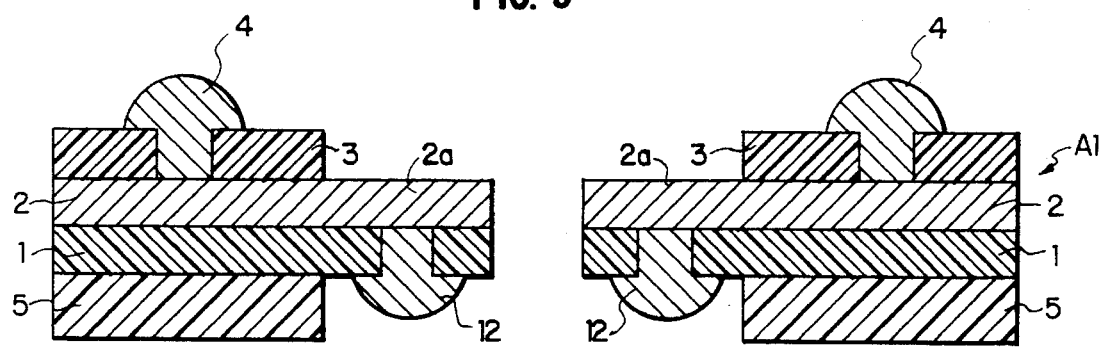
FIG. 9 is an enlarged cross sectional view showing still another example of the first electrically conductive circuit board A1.

In the embodiment shown in FIG. 9, it should be noted that an insulating substrate 1 is also formed at the surface of the lead 2a facing the second electrically conductive circuit board A2, and bumps 12, which are contacted with the terminals 8d of the second electrically conductive circuit board A2, are formed in the insulating substrate 1 at the position facing the second electrically conductive circuit board A2. The bumps 12 are formed in the same manner as described above. According to the embodiment shown in FIG. 9, the lead 2a can be more easily attached to the terminal 8d by soldering or by a thermal compression, which results in improving the productivity.

2. Second Electrically Conductive Circuit Board A2

FIG. 10 to FIG. 13 are cross sectional views showing examples of the second electrically conductive circuit board A2, and by applying the technique of producing a conventional multi-chip module (MCM) substrate, the second electrically conductive circuit boards A2, as shown in FIG. 10 to FIG. 13, can be produced.

Figure 10:
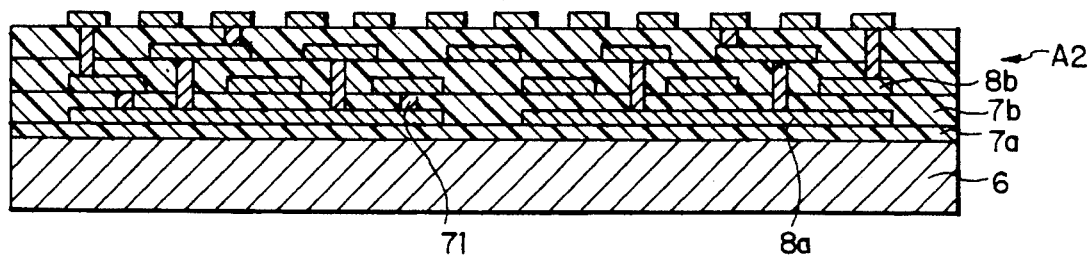
FIG. 10 is an enlarged cross sectional view showing one example of the second electrically conductive circuit board A2.
Figure 11:
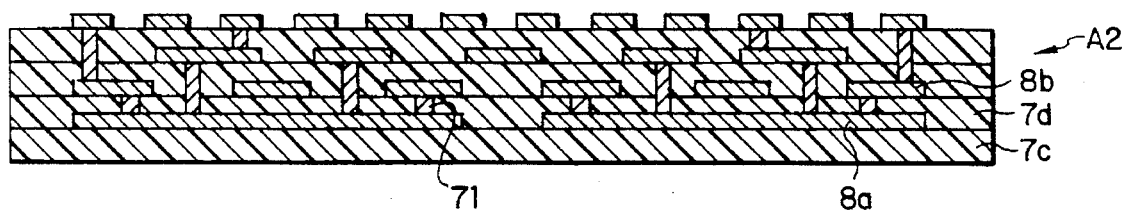
FIG. 11 is an enlarged cross sectional view showing another example of the second electrically conductive circuit board A2.
Figure 12:
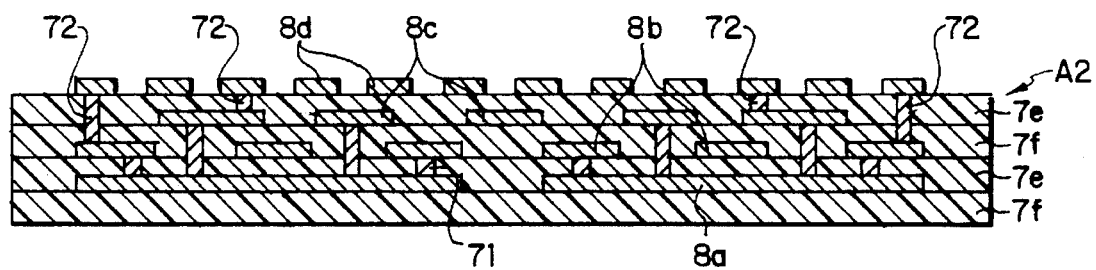
FIG. 12 is an enlarged cross sectional view showing still another example of the second electrically conductive circuit board A2.

The types of the MCM substrate can be mainly classified into: MCM-D, as shown in FIG. 10; MCM-C, as shown in FIG. 11; and MCM-L, as shown in FIG. 12. Each of these MCM substrates can be utilized as the second electrically conductive circuit board A2.

The production steps of the second electrically conductive circuit boards A2 are explained below.

a. Production Step of MCM-D

FIG. 14 shows the production steps of the second electrically conductive circuit board A2, as shown in FIG. 10.

Figure 14A:
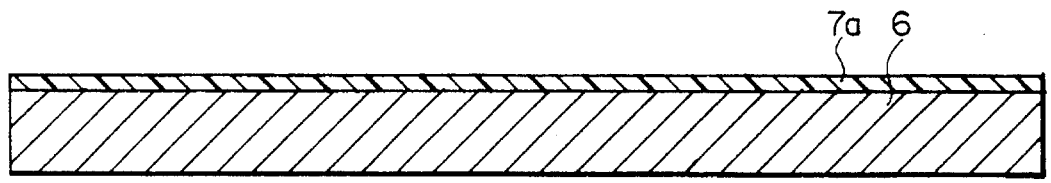
FIG. 14 including parts (a–d) is a cross sectional view showing the production steps of the second electrically conductive wiring having a resistor connected thereto.
Figure 14B:
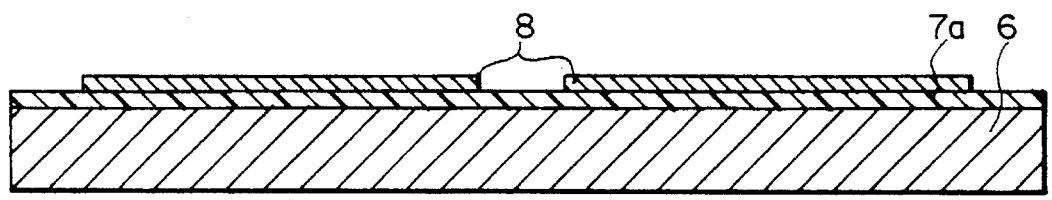
Figure 14C:
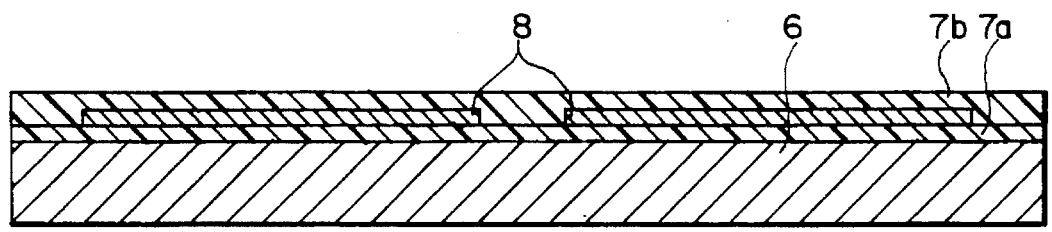
Figure 14D:
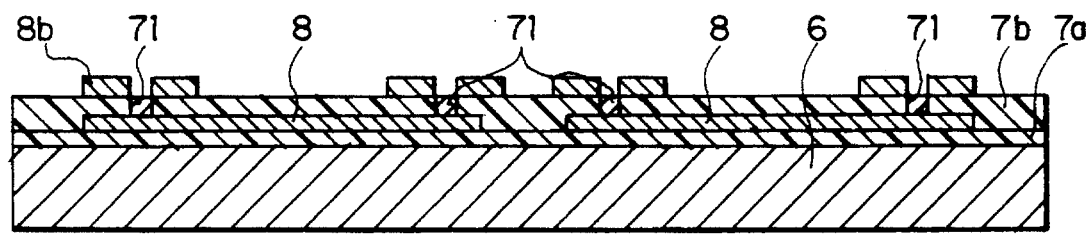

First, as shown in FIG. 14(a), a first insulator layer 7a is formed on a substrate 6, such as a ceramic substrate (AlN= CTE: 4.1 ppm), a silicon substrate (CTE: 3.0 ppm), a glass substrate (borosilicate glass=CTE: 3.2 ppm), a metal substrate (42 Alloy=CTE: 4.5 ppm), etc. The insulating layer 7a is formed by the formation of an inorganic material, such as by a sputtering vapor deposition of $SiO_2$, etc., a chemical vapor deposition (CVD) of diamond, etc., or is formed by spin coating or spray coating of an organic material such as a polyimide resin, an epoxy resin, etc.

The term "CTE" (coefficient of thermal expansion), as described above, is the value at a temperature raising rate of 2° C./minute using a thermal machine analytical apparatus (TMA).

After forming electrically conductive wirings 8, which become wire conductors on the first insulating layer 7a, in definite forms by a sputtering vapor deposition, an electroless plating method, etc., as shown in FIG. 14(*b*), a second insulating layer 7b is formed thereon in the same manner as described above as shown in FIG. 14(*c*).

In FIG. 14(*d*), via holes 71 are formed in the second insulating layer 7b to electrically connect the layers of the electrically conductive wirings 8. Examples of a dry etching method utilizing a high energy beam which can be used to form the via holes 71 are a laser light such as an excimer laser, a carbonic acid gas laser, a YAG laser, an Ar laser, etc.; ion beam etching; sputtering etching; electro-spark machining; etc. Further, the via holes 71 can be formed such that a photosensitive organic material such as a polyimide resin, an epoxy resin, BCB, etc., is used as the second insulating layer and is subjected to an ultraviolet exposure followed by development. Furthermore, a sputtering vapor deposition or electroless plating of an electrically conductive metal is applied again to impart an electrical conductivity to the wall surfaces of the via holes 71 and also form second electrically conductive wirings 8b.

By repeating these steps until obtaining the necessary number of wiring layers, the second electrically conductive wiring of a multilayer structure is formed, whereby the second electrically conductive circuit board (printed circuit board) A2 can be produced.

b. Production Step of MCM-C

As shown in FIG. 11, ceramic particles such as $Al_2O_3$ (CTE: 6.5 ppm), AlN (CTE: 4.1 ppm), Si/BeO (CTE: 3.7 ppm), etc., and an organic material such as polyvinyl butyral, polymethyl methacrylate, etc., as a binder are mixed together with a solvent and a plasticizer, and the resulting mixture is formed into a sheet and dried to form a green sheet 7c. To form an electrically conductive wiring 8a, a mixture of a metal powder and an organic binder (electrically conductive paste ink) is formed on the green sheet 7c in a definite form by screen printing.

Other green sheet 7d is formed in the same manner as described above. If necessary, via holes 71 are formed in the green sheet 7d by punching, etc., to electrically connect the layers of the electrically conductive wirings 8a. Electrically conductive wirings 8b are formed on the green sheet 7d in definite forms in the same manner as described above. In this case, the electrically conductive paste ink enters the via holes 71 to form an electrically conductive path between the layers of the electrically conductive wirings 8a and 8b.

By successively laminating the necessary number of these green sheets and sintering them at high temperature, the second electrically conductive wirings of a multilayer structure are formed and the second electrically conductive circuit board (printed circuit board) A2 can be produced.

The metal powder which can be used is the powder of a metal such as Ag, Pd, Au, Cu, Ni, Mo, W, etc., and the alloys thereof.

c. Production Step of MCM-L

As shown in FIG. 12, MCM-L is a multilayer substrate using a substrate material such as an ordinary glass epoxy (CTE: 18 ppm), a BT resin (CTE: 12 ppm), etc. In the most general production steps, via holes 71 are formed in a glass epoxy substrate 7e having a copper foil laminated on both the surfaces thereof. After imparting an electrical conductivity to the via holes 71 by applying electroless plating to the whole substrate 7e, thick copper plating is applied by electrolytic plating to complete via hole plating.

Etching resists are formed on portions of electrically conductive wirings 8a and 8b and on the via holes 71 using a photoetching step. Unnecessary portions of copper are removed by etching using an etching liquid containing $Fe_2O_3$ as the main component.

The necessary number of such substrates 7e are prepared, superposed via a prepreg (i.e., a resin sheet in a semi-cured state) 7f, such as a BT resin between the substrates, and press-adhered to each other under heating to obtain a multilayer substrate. Finally, to electrically connect the layers of the electrically conductive wirings 8c and 8d, via holes 72 are formed at the desired positions, and, by applying thereto electroless plating and electrolytic plating, the second electrically conductive wiring of the multilayer structure is formed, whereby the second electrically conductive circuit board (printed circuit board) A2 can be produced.

Figure 13:
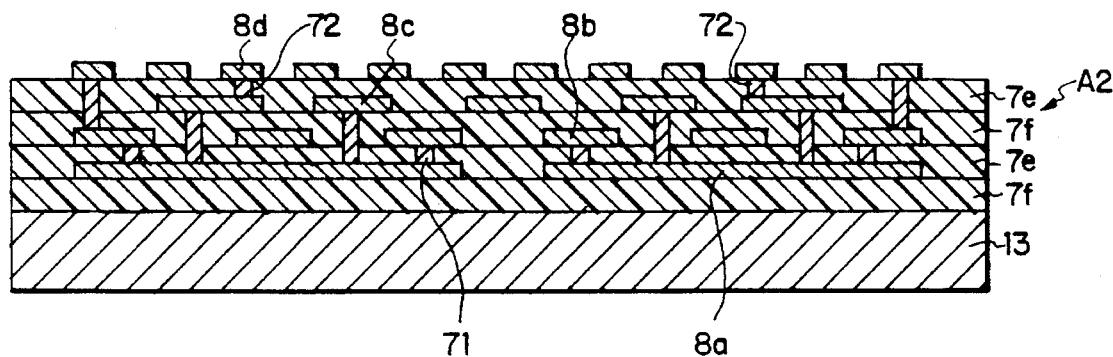
FIG. 13 is an enlarged cross sectional view showing another example of the second electrically conductive circuit board A2.

If necessary, for the purpose of increasing the strength of the multilayer substrate, a metal plate 13 comprising 42-Alloy, etc., may be applied to the back surface of the multilayer substrate via a prepreg 7f, such as a glass epoxy, a BT resin, etc., as shown in FIG. 13.

Figure 15:
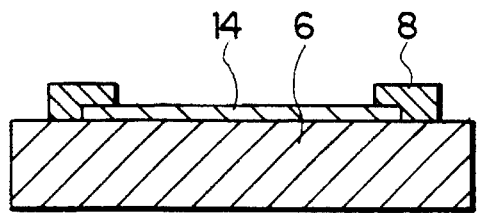
FIG. 15 is an enlarged cross sectional view showing one example of the second electrically conductive wirings having a resistor connected thereto.
Figure 16:
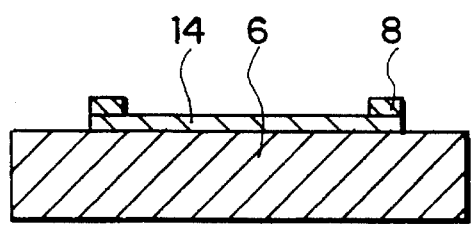
FIG. 16 is an enlarged cross sectional view showing another example of the second electrically conductive wirings having a resistor connected thereto.

A resistor may be connected in series to the second electrically conductive wirings, and, in this case, fundamentally, as shown in FIG. 15 or FIG. 16, after previously forming a resistor 14 on a substrate 6, electrically conductive wirings 8 are formed on the resistor 14 (FIG. 16) or on the substrate 6 such that the wirings 8 are connected to the resistor 14 (FIG. 15). In addition, to increase the connection reliability between the electrically conductive wirings 8 and the resistor 14, it is preferred to enlarge the contact area of the electrically conductive wiring 8 and the resistor 14 as shown in FIG. 15.

The material which can be used for the resistor is an alloy of Ru, W, Ni, Co, Ti, Cu, etc., and a method of forming the resistor is a sputtering vapor deposition, CVD, electrolytic plating, electroless plating, etc.

According to this embodiment, the load voltage can be applied to a material to be tested, and the occurrence of a short-circuit in the material to be tested can be prevented.

Figure 17:
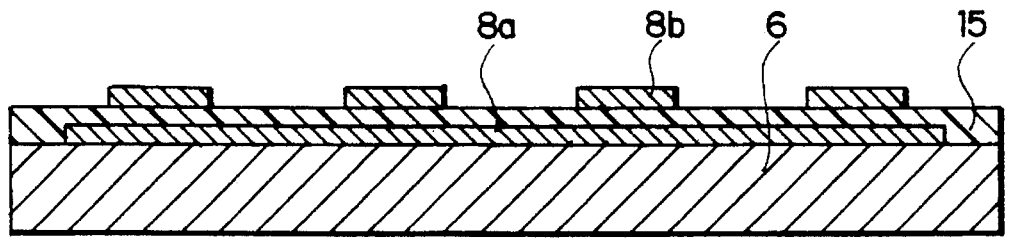
FIG. 17 is an enlarged cross sectional view showing the second electrically conductive wirings having a condenser connected thereto.

A condenser may be connected to the second electrically conductive wirings in parallel in regard to a resistor, and fundamentally, as shown in FIG. 17, a dielectric layer 15 (which insulates the electrically conductive wirings 8a and 8b on the substrate 6) is formed. As the dielectric material for the condenser, a dielectric material having a high dielectric constant can be formed between electrically conductive electrodes, or the insulator of the multilayer substrate can be used as the dielectric of the condenser.

The dielectric layer 15 can be formed by the formation of an inorganic material such as by a sputtering vapor deposition of SiO2, etc., a chemical vapor deposition (CVD) of diamond, etc., or is formed by spin coating or spray coating an organic material such as a polyimide resin, an epoxy resin, etc.

According to this embodiment, the occurrence of noise can be reduced.

The resistor and the condenser described above may be formed on one layer of the second electrically conductive wiring in the second electrically conductive circuit board A2 of a multilayer structure. Conventional chip parts are used as the resistor and the condenser, and can be mounted on the surface (the surface forming the terminal 8d) of the second electrically conductive circuit board A2 at the position which does not cause a hindrance when contacting the second electrically conductive circuit board A2 to A1 and then to a wafer. That is, commercially available discrete devices may be mounted by soldering, etc., or they can be directly formed on the second electrically conductive circuit board A2 by a lithographic method.

Where there are a plurality of materials to be tested, for example, where the materials to be tested are ICs in a silicon wafer, the number of input and output wirings to an electric tester can be greatly reduced by connecting each of the signal wirings of the second electrically conductive wiring to the terminal of each IC in parallel to each other via resistors. In this case, since ground wirings can be connected in parallel, the number of the input and output wirings can be further reduced.

Figure 18:
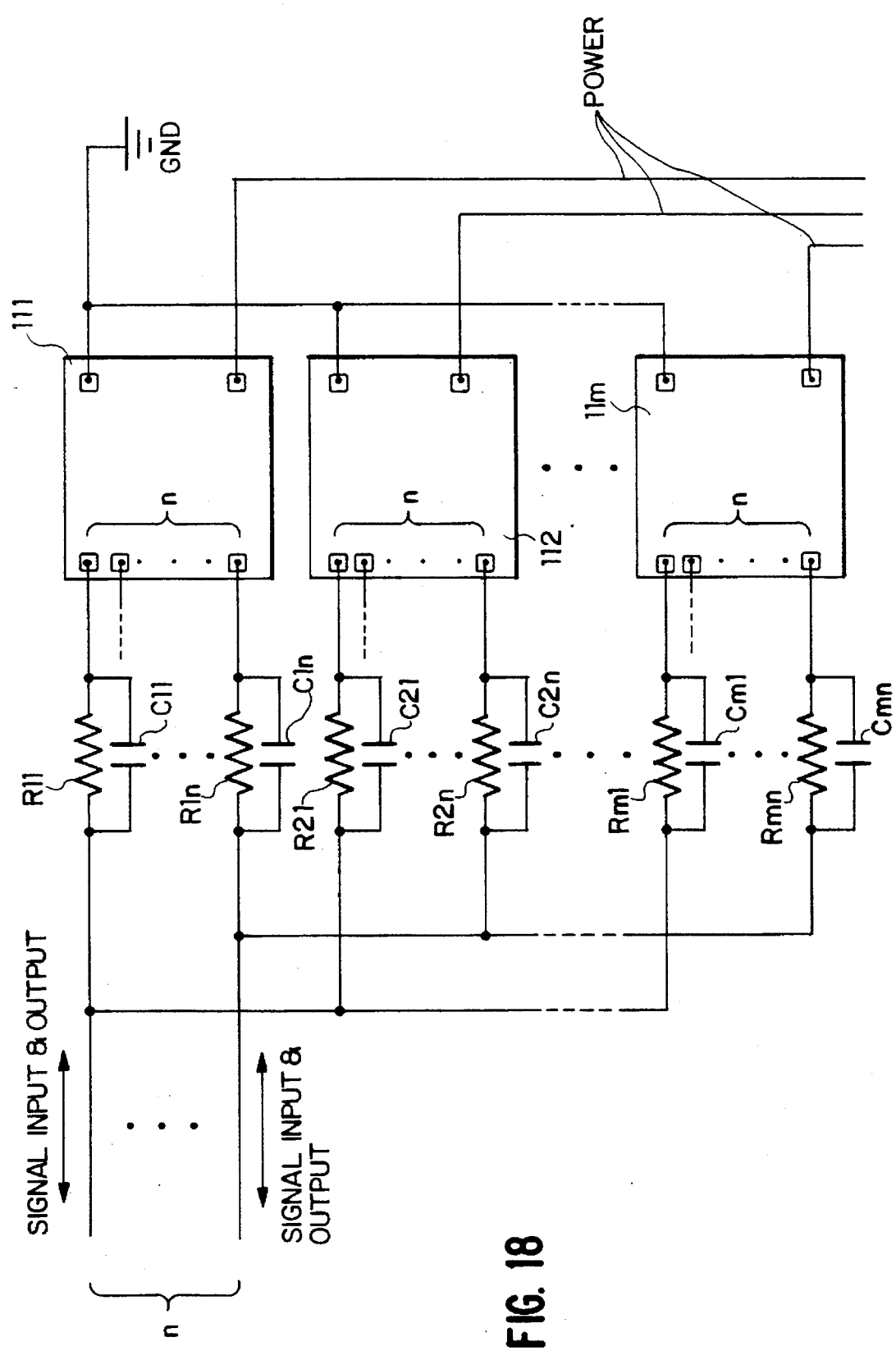
FIG. 18 is a schematic view showing an electrically equivalent circuit of the probe structure P.

FIG. 18 is a schematic view of an electrically equivalent circuit of the probe structure.

In FIG. 18, a plurality (m) of ICs 111, 112, . . . , 11*m* are formed on a wafer. On each of the ICs 111, 112, . . . , 11*m* are formed pads (n) to be contacted with bumps 4. The signal wirings of a second electrically conductive wiring corresponding to each pad are connected in parallel via a resistor per bumps 4 which are contacted with the corresponding pads between each ICs 111, 112, . . . , 11*m*. Practically, the signal wirings of the second electrically conductive wiring corresponding to the first pads of each of the ICs 111, 112, . . . , 11*m* are connected in parallel via resistors R11, R21, . . . , Rm1, and the signal wirings of the second electrically conductive wiring corresponding to the subsequent (n)th pads are similarly connected in parallel. Further, to each of the resistors R11, R21, . . . , Rm1, . . . , R1n, R2n, . . . , Rmn is connected in parallel to each of condensers C11, C21, . . ., Cm1, . . . , C1n, C2n, . . . , Cmn, respectively. Furthermore, each ground wiring is connected in parallel to each of the ICs 111, 112, . . . , 11*m*.

According to this embodiment, since the signal treatment to a plurality (m) of ICs 111, 112, . . . , 11*m* can be treated in parallel, the number of the input and output wirings to an electric tester can be reduced to n.

On the other hand, since each of electric power supplying wirings is independently connected to each of the ICs 111, 112, . . . , 11*m*, the problem can be overcome that where the electric power supplying wirings are connected in parallel, if the power supplying wire in even one of the materials to be tested is grounded by short circuit, the electric power is not simultaneously supplied to other materials to be tested so as to make the testing thereof impossible.

The second electrically conductive circuit board A2, described above, is a multilayer circuit board having a coefficient of thermal expansion which is the same as or similar to that of the material to be tested, and where the material to be tested is, for example, an IC in a silicon wafer, the coefficient of thermal expansion (CTE) of the second electrically conductive circuit board A2 is set to become from 2 to 50 ppm, and, preferably, from 3 to 10 ppm.

3. Final Assembly of Probe Structure P

As shown in FIG. 1, after conducting the position matching of the first electrically conductive circuit board A1 and the second electrically conductive circuit board A2 produced as described above and adhering them with an epoxy adhesive using a flip chip bonder (manufactured by Research Devices Co.), the lead 2*a* of the first electrically conductive circuit board A1 is connected to the second electrically conductive circuit board A2 by a method of thermal compression such as single point bonding, gang bonding, etc., or solder reflowing, etc.

Figure 19:
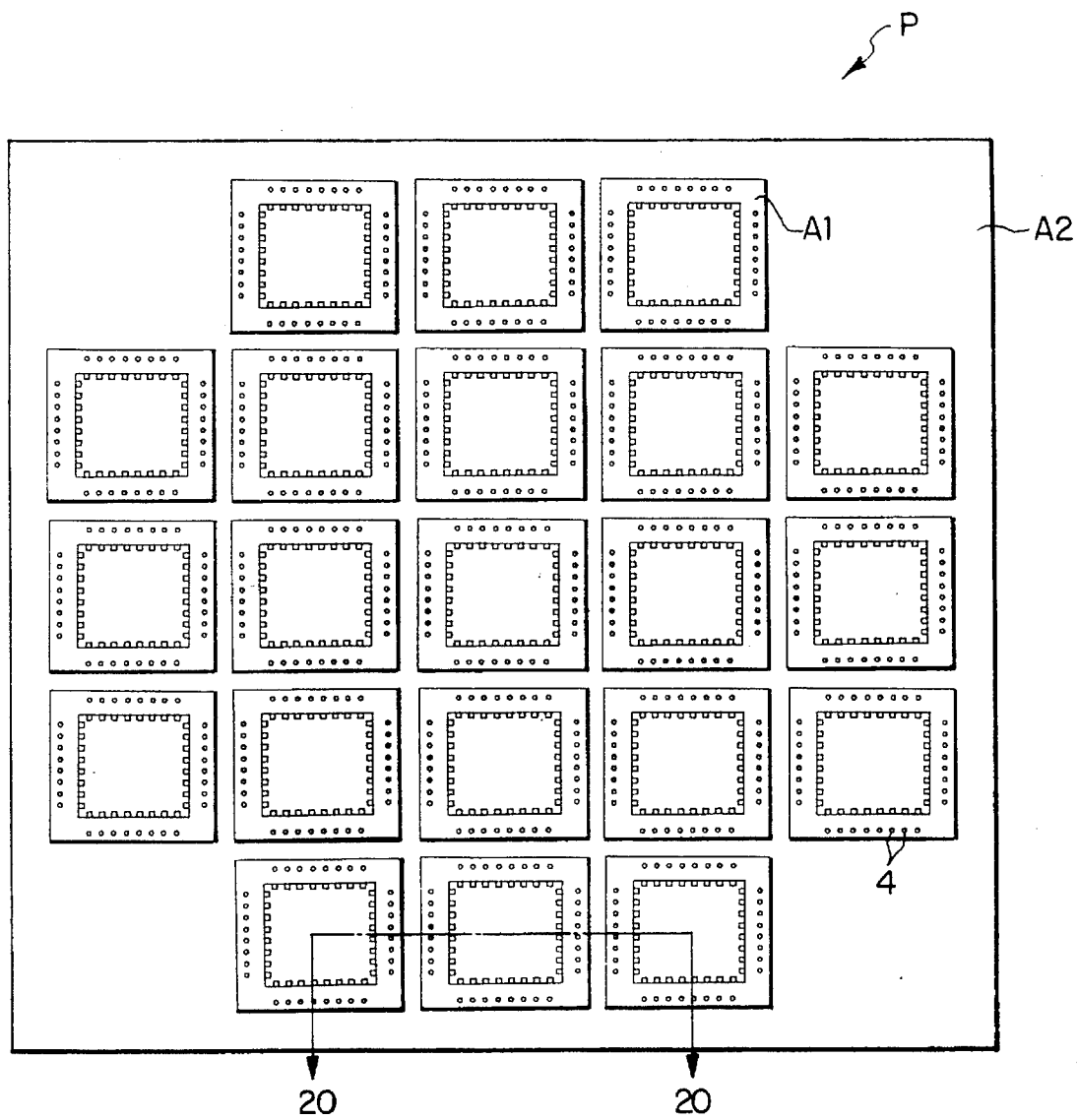
FIG. 19 is a plain view showing one example of the probe structure P.
Figure 20:
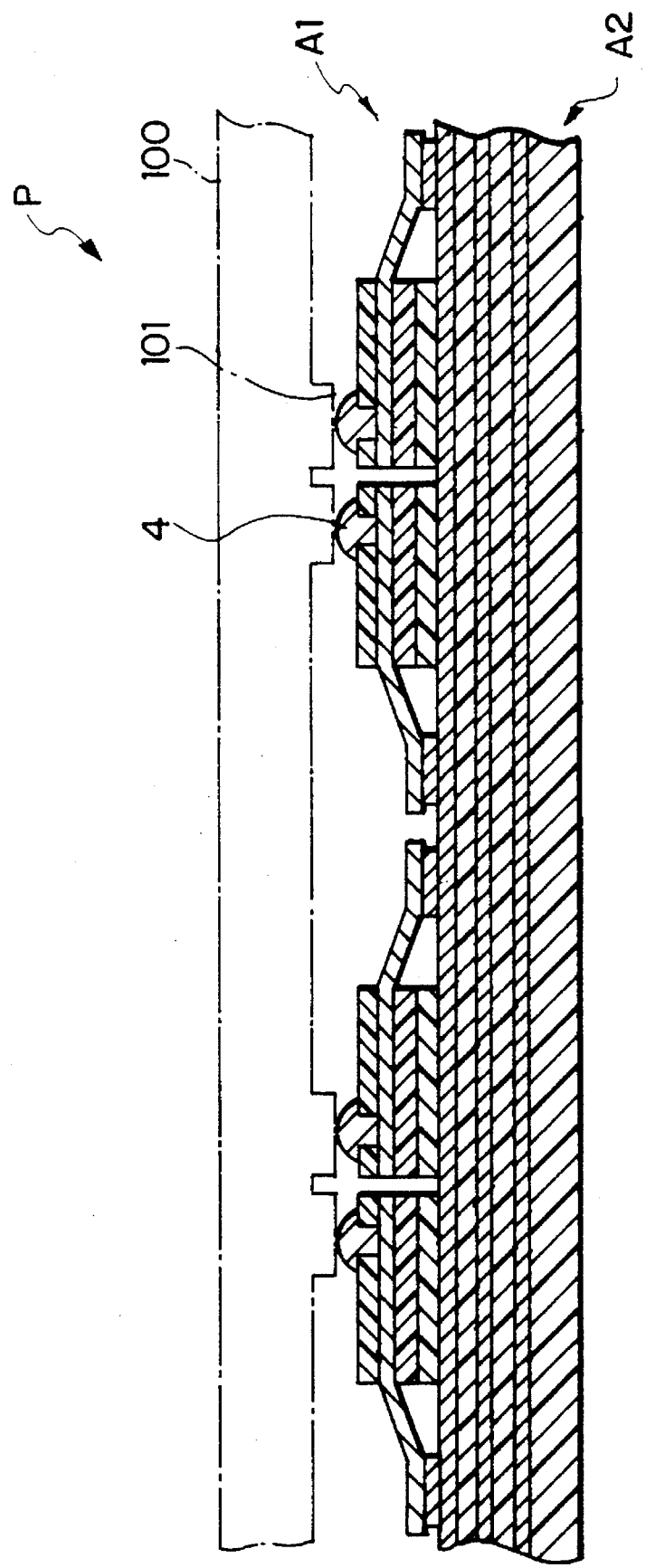
FIG. 20 is the cross sectional view taken along the line C–D of FIG. 19.

FIG. 19 is a plain view of the probe structure P obtained by adhering and fixing the first electrically conductive circuit board A1 (shown by FIG. 2) onto the second electrically conductive circuit board A2 (shown by FIG. 11), and FIG. 20 is the cross sectional view taken along the line C–D of FIG. 19. In FIG. 19 and FIG. 20, a plurality of the first electrically conductive circuit boards A1 are fixed on the second electrically conductive circuit board A2 at the positions corresponding to the ICs formed on a wafer 100, and the bumps 4 of each first electrically conductive circuit board A1 are contacted with the pads 101 of each IC.

The probe structure P, formed by fixing the first electrically conductive circuit boards A1 on the second electrically conductive circuit board A2, is further fixed to a printed substrate, etc., and wiring is conducted to complete the assembly.

Where the size of a wafer 100 is large, it sometimes happens that the large second electrically conductive circuit board A2 corresponding to the size of wafer is difficult to produce. In this case, after preparing the second electrically conductive circuit board A2 by splitting into a plurality of the electrically conductive circuit boards each having a size which can be easily prepared, these electrically conductive circuit boards are joined or fixed to one printed substrate, etc., in one body followed by wiring to obtain the probe structure corresponding to a wafer 100 of a large size. In this case, fixing of the second electrically conductive circuit board A2 to the first electrically conductive circuit board A1 may be conducted before or after joining a plurality of the electrically conductive circuit boards prepared in split parts.

Figure 21:
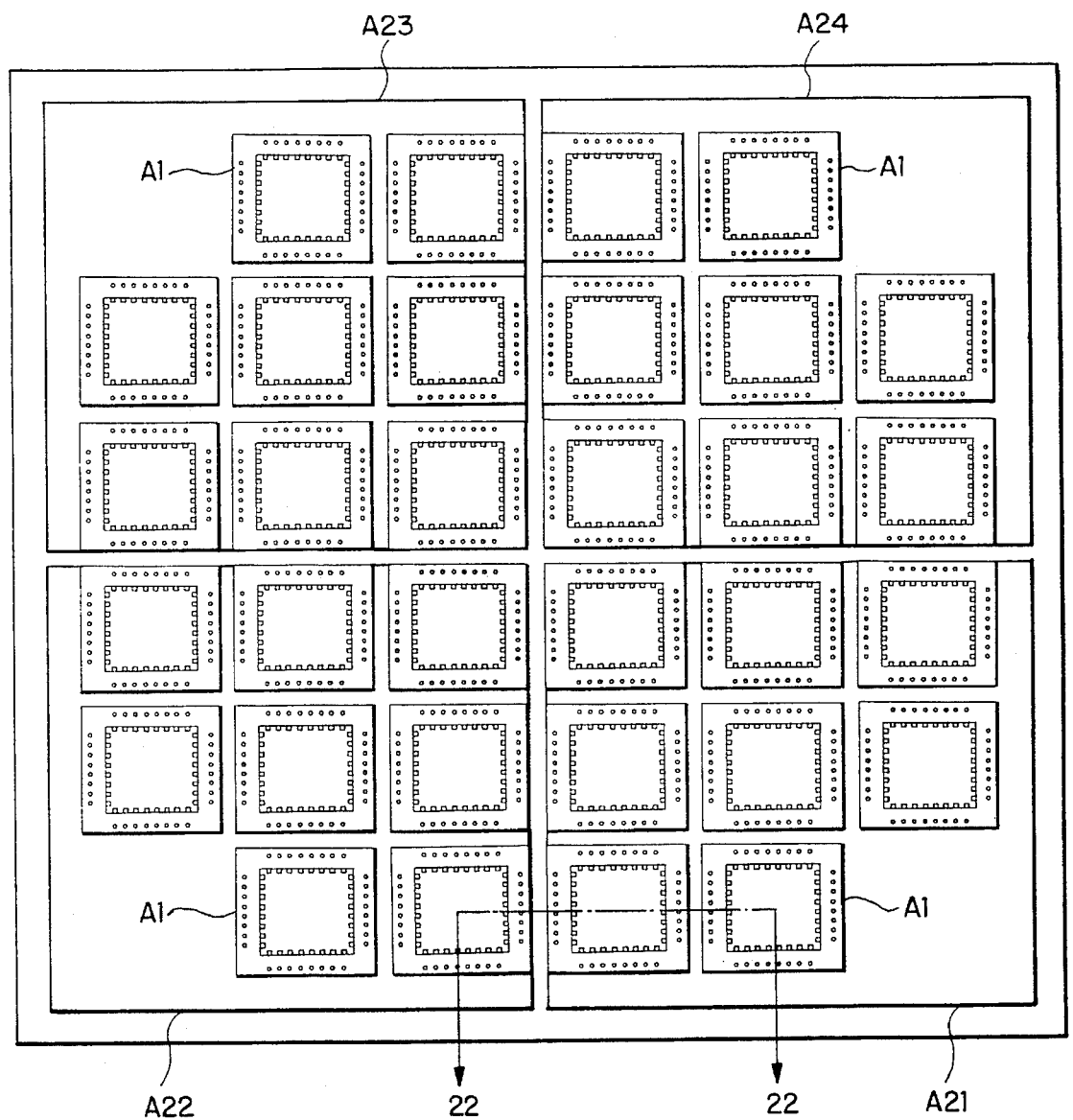
FIG. 21 is a plain view showing another example of the probe structure P.
Figure 22:
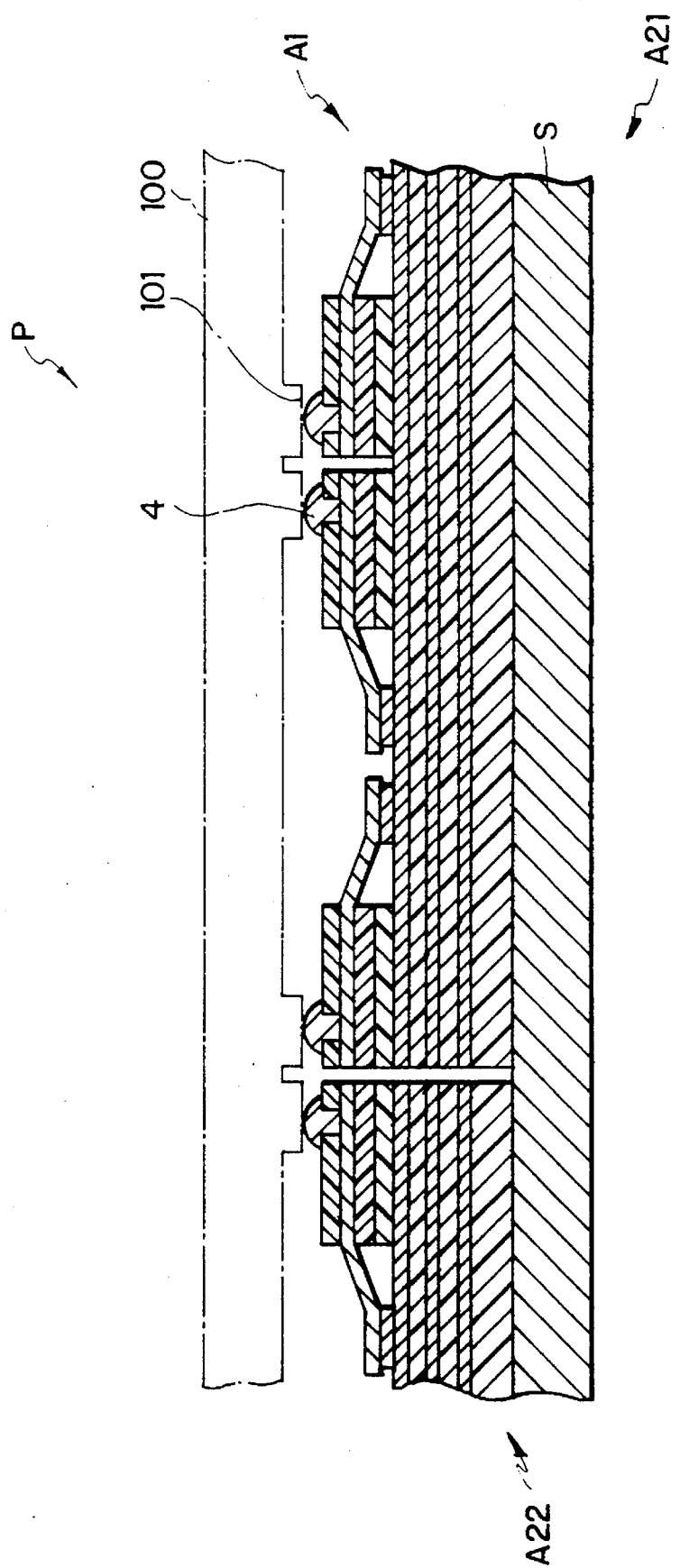
FIG. 22 is the cross sectional view taken along the line E–F of FIG. 21.

FIG. 21 is a plain view showing one example of the probe structure P wherein the second electrically conductive circuit board A2 is prepared by splitting into a plurality of parts, and FIG. 22 is the cross sectional view taken along the line E–F of FIG. 21.

In the embodiment shown in FIG. 21 and FIG. 22, the second electrically conductive circuit board A2 comprises 4 electrically conductive circuit boards A21, A22, A23, and A24 fixed to a printed substrate S followed by wiring, and the second electrically conductive circuit boards A2 is fixed by adhering on the first electrically conductive circuit board A1 in the same method as described above.

According to the probe structure of the present invention, the occurrence of the positional shift of the contact portions between the probe structure and the terminals of the material to be tested (which is caused by thermal expansion) is prevented, whereby the electrical connection thereof can be effectively established. Further, where the first electrically conductive circuit board is damaged, repairing or the exchange thereof becomes easy.

Where an elastic body is disposed between the first electrically conductive circuit board and the second electrically conductive circuit board, the occurrence of the poor connection by the variation in the heights between the terminals of a material to be tested (e.g., pads of IC) and the contact portions of the probe structure is prevented, whereby the compliance characteristics are further improved and the electrical connection is more effectively ensured.

Where a material to be tested is an IC formed on a wafer before dicing, the test cost is reduced, the testing apparatus can be small-sized, the testing time is shortened, the yield of ICs is improved since the cause of a defect(s) in the production of the IC can be identified and corrected, and the shipping is rationalized as compared with the case of IC chips after dicing.

By preparing the second electrically conductive circuit board in split parts, the probe structure having a large size can be easily prepared, whereby many ICs formed on a wafer having a large size can be tested at the same time and the test can be conducted more efficiently.

By connecting one or at least two resistors in series to the signal wiring in the second electrically conductive wiring, a load voltage can be applied to a material to be tested and the occurrence of a short-circuit in the material to be tested can be prevented. In particular, where a condenser is connected in parallel to the resistor, the occurrence of noise can be reduced.

Where the number of materials to be tested is plural (as ICs formed on a wafer before dicing) and each of the signal wirings corresponding to the terminal of each material to be tested are mutually connected in parallel via the resistors, the ground wirings in the second electrically conductive wirings are connected in parallel and can be connected to one common wiring, whereby the number of the input and output wirings to an electric tester can be reduced.

Where the electric power supplying wirings in the second electrically conductive wiring are mutually independent wirings, the problem can be overcome that where electric power supplying wirings are connected in parallel, if the power supplying wiring in even one of the materials to be tested is grounded by short-circuit, the electric power is not simultaneously supplied to other materials to be tested so as to make the testing thereof impossible.

While the invention has been described in detail and with reference to specific embodiments thereof, it will be apparent to one skilled in the art that various changes and modifications can be made therein without departing from the spirit and scope thereof.

What is claimed is:

1. A probe structure comprising:
   a first electrically conductive circuit board having a structure wherein contact portions, which are contacted with the terminals of a material to be tested, are disposed in a first insulator in the direction of the thickness thereof so as to penetrate the insulator and the contact portions are connected to a first electrically conductive wiring formed between the first insulator and a second insulator; and
   a second electrically conductive circuit board having a coefficient of thermal expansion which is the same as or similar to that of the material to be tested, and having a structure wherein the first electrically conductive wiring is connected to a second electrically conductive wiring which is connected to an electric tester for testing the electric characteristics of the material to be tested; wherein,
   said first electrically conductive circuit board is electrically connected to said second electrically conductive circuit board, and an elastic body is disposed between the first electrically conductive circuit board and the second electrically conductive circuit board.

2. A probe structure of claim 1, wherein the second electrically conductive wiring has at least one resistor which is connected in series to the signal wirings.

3. A probe structure of claim 2, wherein a condenser is connected in parallel to the resistor.

4. A probe structure of claim 1, wherein electric power supplying wires are mutually and independently wired to the second electrically conductive wirings.

5. A probe structure of claim 1, wherein the second electrically conductive circuit board comprises a plurality of electrically conductive circuit boards joined to each other or fixed to one printed substrate in one body and wired.

6. A probe structure of claim 1, wherein the material to be tested is integrated circuits formed on a wafer before dicing.

* * * * *